United States Patent [19]
Williford

[11] 3,714,603
[45] Jan. 30, 1973

[54] RC ACTIVE FILTER APPARATUS

[75] Inventor: Jerry G. Williford, Tustin, Calif.

[73] Assignee: Collins Radio Company, Dallas, Tex.

[22] Filed: Sept. 27, 1971

[21] Appl. No.: 183,910

[52] U.S. Cl. ....................330/109, 330/30 R, 330/31, 330/9

[51] Int. Cl. ....................H03f 3/50

[58] Field of Search ........330/21, 30, 9, 31, 103, 104, 330/107, 109

[56] References Cited

UNITED STATES PATENTS

| | | | |
|---|---|---|---|
| 2,459,046 | 1/1949 | Rieke | 330/109 |
| 3,564,441 | 2/1971 | Eide | 330/21 |

*Primary Examiner*—Roy Lake
*Attorney*—Bruce C. Lutz et al.

[57] ABSTRACT

A complex filter or filter section using an amplifier with a plurality of feedback loops which may be used for bandpass filtration or for filters requiring complex transmission zeros.

3 Claims, 4 Drawing Figures

RC ACTIVE FILTER APPARATUS

THE INVENTION

The present invention is directed primarily to electronics and more specifically to a RC active filter.

While the prior art has produced many variations of RC active filters, all of these having equivalent performance have required an excess of parts as compared to the present invention. In the trend towards smaller and smaller package electronics, the capacitor remains one of the largest components. Any circuit design which can eliminate one or more capacitors, as compared to previous designs, is normally chosen for use in preference to previous designs even if more resistors are used. As is well known, capacitors not only take up more space but are decidedly more expensive than resistors and in many cases more expensive than operational amplifiers.

It is therefore an object of the present invention to provide a cheaper and more compact filter or filter section.

Other objects and advantages may be ascertained from a reading of the specification and claims in conjunction with the drawings wherein:

Figure 1:
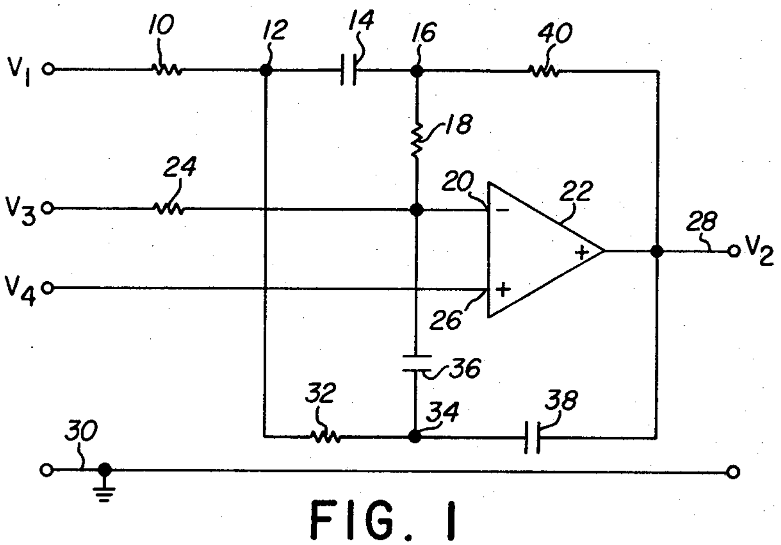
FIG. 1 is a schematic diagram of a basic embodiment of the invention.

In FIG. 1 a resistor 10 is connected between an input $V_1$ and a junction point 12. A capacitor 14 is connected between junction point 12 and junction point 16.

A resistor 18 is connected between junction point 16 and an inverting input 20 of an operational amplifier generally designated as 22 and having an output 28. A resistor 24 is connected between an input terminal $V_3$ and input 20 of amplifier 22. A further input $V_4$ is connected to a non-inverting input 26 of amplifier 22. A further terminal is indicated as 30 and is the reference or ground potential. All signals which are applied to the amplifier are applied with respect to reference potential 30. It will be further realized that the amplifier 22 is connected to a source of positive and negative power not shown but the amplifier itself need not be connected directly to ground in many embodiments. A resistor 32 is connected between junction point 12 and a junction point 34. A capacitor 36 is connected between input 20 and junction point 34. A further capacitor 38 is connected between junction point 34 and output 28. A final resistor 40 is connected between junction point 16 and output 28.

Figure 2:
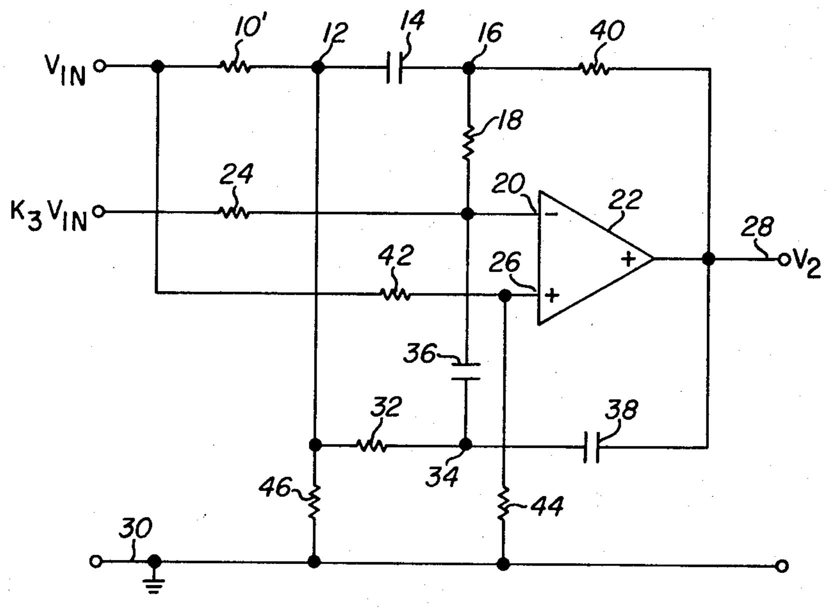
FIG. 2 is a schematic drawing of a universal embodiment of the invention.

In describing FIG. 2, the same components will be numbered identical with FIG. 1 where appropriate. As will be noted, the $V_1$ designation of FIG. 1 has been altered to $V_{IN}$ in FIG. 2. Further, a pair of resistors 42 and 44 are connected in series between $V_{IN}$ and ground 30 with an intermediate junction point connected to the non-inverting input 26 of amplifier 22. A final resistor 46 is connected between junction point 12 and ground 30.

Figure 3:
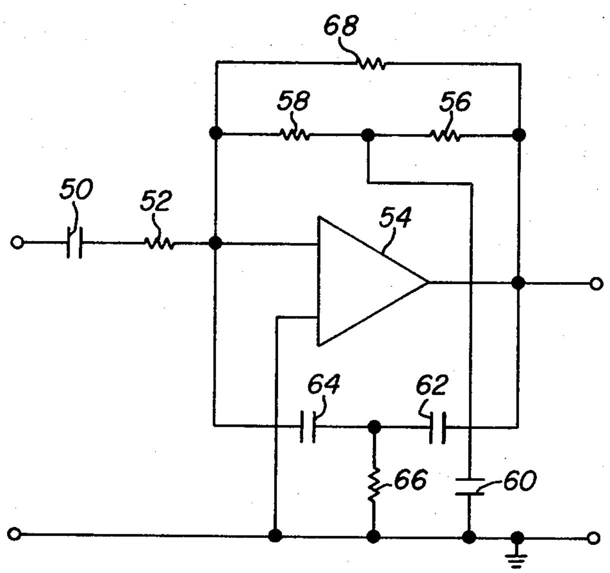
PRIOR ART FIG. 3
FIG. 3 is a schematic diagram of a prior art filter which will accomplish the same filtration as FIG. 1.

The prior art circuit of FIG. 3 has a capacitor 50 connected in series with a resistor 52 between an input of the filter and an input of an amplifier 54. A pair of resistors 56 and 58 in combination with a capacitor 60 form a first T feedback loop around amplifier 54 with capacitor 60 being connected to ground. A pair of capacitors 62 and 64 along with a T resistor 66 form a second T feedback loop around amplifier 54. A final resistor 68 is connected in parallel with resistors 56 and 58.

Figure 4:
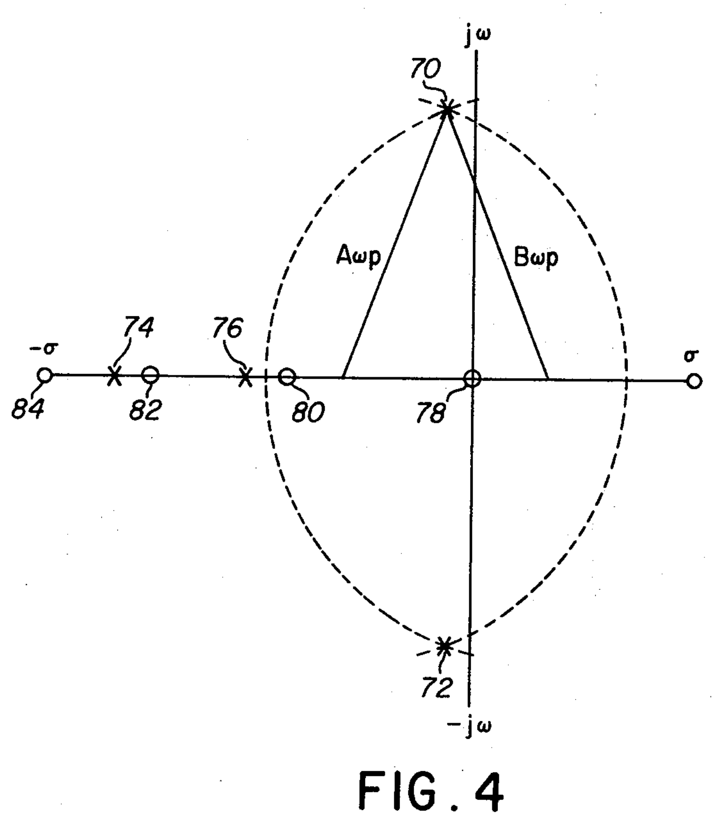
FIG. 4 is a diagram representing the position of poles and zeros in a complex frequency plane presentation.

FIG. 4 shows a representation having an imaginary or $j\omega$ axis and a real or $\sigma$ axis. In the diagram, poles (shown as X's) 70, 72, 74, and 76 are shown as well as zeros 78, 80, 82, and 84. A first radius of curvature labeled $A\omega p$ is shown as well as the second radius of curvature $B\omega p$. (These are the paths along which the poles move as a junction of resistors 10 and 68 with A representing the radius of curvature for the twin-tee bandpass filter of FIG. 3 in the prior art and the B radius of curvature being the one applicable to FIG. 1.) The zero 78 is at the crossing of the real and imaginary axis with the zero 84 lying at $\infty$ (infinity).

THE OPERATION

A discussion of the prior art will first be provided as a background to the present invention. If the resistor 68 is removed from FIG. 3, a very well known twin-tee filter of the prior art is obtained. FIG. 4 is representative of the pole-zero representation of this circuit. Ideally, if all of the components are of the correct value, the pole zero pair 76 and 80 will be positioned in exactly the same place on the real axis and will cancel out. Likewise, the same will occur for the pole zero pair 74 and 82. However, due to component variations, these two pairs of poles and zeros will normally be slightly spaced apart.

The transfer function for this filter as represented by FIG. 4 is as follows in Equation 1.

$$[-A2\sigma S(S+a)(S+c)]/[(S^2+2\sigma S+\omega_o^2)(S+b)(S+d)]$$

Equation 1

Where the pole zero pairs cancel, the $S+a$, $S+b$, $S+c$, and $S+d$ terms in the numerator and denominator will cease to exist. Since the amount of noncancellation is normally quite small and since these factors greatly complicate working with the transfer function, they are normally assumed to have little effect on the results of working with the equation and are disregarded.

For different filtering effects, it is desirable to move the poles 70 and 72 away from the $j\omega$ axis. By moving the poles away, the Q of the circuit is reduced. Moving these poles vertically affects the frequency of operation of the bandpass filter. In other words, this affects the center frequency of the band of frequencies that will be passed by the filter. The vertical position is in the initial instance affected by selection of components. However, when an adjustment of Q is being made by means of resistor 68, the pole will follow the dash line on the extremity of the radius of curvature $A\omega p$. As will be noted, as the Q is reduced in the circuit of FIG. 3 the frequency of the filter is increased. Thus, positioning of the poles 70 and 72 requires consideration of both component values and the Q desired.

The normal prior art method of adjusting Q has been to unbalance the two-tee feedback networks. This, however, has the very undesirable effect of increasing the spacing between the pole zero pairs 74, 76, 80, and 82. A more recent method has been to utilize the resistor 68 which, as it decreased in value, lowers the Q of the circuit by positioning the poles 70 and 72 further from the imaginary axis along the dash line which is representative of the path followed by the radius line $A\omega p$.

Turning now to the present invention and FIG. 1 specifically, an input signal applied between ground 30 and junction point 12 will provide a filter having exactly the same pole zero representation as shown in FIG. 4. However, the radius of curvature line for the poles of this filter is $B\omega p$. Thus, as the Q is decreased, the frequency passed by the filter decreases. The Q is altered in the circuit of FIG. 1 by increasing the value of the resistance of resistor 10. Thus, normal circuit operation calls for the input signal to be applied between ground 30 and input terminal $V_1$. Again, if all the components of FIG. 1 except for resistors 10 and 24 are exactly as indicated by the following formulas, the pole-zero pairs 74, 76, 80, and 82 will be positioned so as to exactly cancel and there will be no effect by these pole zero pairs on the filter operation. Altering the value of resistor 10 has no effect on the cancellation of these pole-zero pairs.

For a simple bandpass filter the input terminals $V_3$ and $V_4$, along with resistor 24, are not required. These inputs are utilized to control the location and existence of complex zeros. Complex zeros are often required in more complex filters requiring a plurality of stages or sections of filtration. The signals applied to terminals $V_3$ and $V_4$ are normally some fraction of the input signal. Thus, in FIG. 2 resistors 42 and 44 have been added to supply a portion of the input signal to non-inverting input 26 of amplifier 22 and resistor 46 has been added to affect the amplitude of the input as provided through resistor 32. The input terminal $K_3V_{IN}$ is connected to ground 30 if the pole frequency is equal to or less than the zero frequency and is connected to input terminal $V_{IN}$ if the pole frequency is greater than the zero frequency.

Referring back to FIG. 1, the output voltage $V_2$ may be expressed as follows in Equation 2.

In the following Equations, $R_1$ through $R_5$ will be used to represent resistors 40, 18, 32, 10, and 24, respectively; while $C_1$ through $C_3$ will be used to represent capacitors 14, 36, and 38, respectively, to reduce the size of the equations.

$$V_2=\frac{\left[\begin{aligned}&-V_1\left[\frac{Y_a}{SC_1}+\frac{Y_bR_3}{SR_2C_2}\right]\\&+V_3\left\{\frac{1}{SR_3R_5C_2}\left[\frac{Y_a}{SC_1}+\frac{Y_bR_3}{SR_2C_2}\right]-\frac{Y_bR_3}{SR_5C_2}\left[-SC_1+\frac{1}{SR_2R_3C_2}+\frac{Y_aY_c}{SC_1}\right]\right\}\\&-V_4\left\{\left[\frac{Y_a}{SC_1}+\frac{Y_bR_3}{SR_2C_2}\right]\left[\frac{Y_d}{SR_3C_2}+\frac{Y_c}{SR_2C_1}\right]-\left[-SC_1+\frac{1}{SR_2R_3C_2}+\frac{Y_aY_c}{SC_1}\right]\left[\frac{1}{SR_2C_1}+\frac{Y_dY_bR_3}{SC_2}-SR_3C_2\right]\right\}\end{aligned}\right]}{\left[\left[SR_3C_3-\frac{1}{SR_1C_1}\right]\left[-SC_1+\frac{1}{SR_2R_3C_2}+\frac{Y_aY_c}{SC_1}\right]+\frac{Y_c}{SR_1C_1}\left[\frac{Y_a}{SC_1}+\frac{Y_bR_3}{SR_2C_2}\right]\right]}$$

Equation 2

If $V_1$ is set equal to $K_1V_{IN}$, $V_3$ is set equal to $K_3V_{IN}$ and $V_4$ is set equal to $K_4V_{IN}$ then the transfer function of $V_2/V_{IN}$ can be expressed as follows in Equation 3.

$$F_{(s)}=\frac{\left[\begin{aligned}&\frac{-K_1S}{R_4}\left[\frac{Y_a}{C_1}+\frac{Y_bR_3}{R_2C_2}\right]\\&-K_3\left\{\frac{Y_bR_3}{R_5C_2}\left[\frac{Y_aY_c}{C_1}+\frac{1}{R_2R_3C_2}-SC_1\right]-\frac{1}{R_3R_5C_2}\left[\frac{Y_a}{C_1}+\frac{Y_bR_3}{R_2C_2}\right]\right\}\\&+K_4\left\{\left[\frac{Y_aY_c}{C_1}+\frac{1}{R_2R_3C_2}-S^2C_1\right]\left[\frac{Y_dY_bR_3}{C_2}+\frac{1}{R_2C_1}-S^2R_3C_2\right]-\left[\frac{Y_a}{C_1}+\frac{Y_bR_3}{R_2C_2}\right]\left[\frac{Y_d}{R_3C_2}+\frac{Y_c}{R_2C_1}\right]\right\}\end{aligned}\right]}{\left[\frac{Y_c}{R_1C_1}\left[\frac{Y_a}{C_1}+\frac{Y_bR_3}{R_2C_2}\right]+\left[S^2R_3C_3-\frac{1}{R_1C_1}\right]\left[\frac{Y_aY_c}{C_1}+\frac{1}{R_2R_3C_2}-S^2C_1\right]\right]}$$

Equation 3

It may further be assumed that capacitors 36 and 38 are equal and are equal to half the capacitance of capacitor 14. Further, it may be assumed that resistors 18 and 40 are equal and are equal to half the value of resistance 32. In this event the admittance at junction point 16 and 34 are identical. In the following equation, $a=1/R_{32}C_{14}$, $c=a+1/R_{10}C_{14}$, and $d=a+1/R_{24}C_{36}$. Upon factoring and cancellation of terms from the numerator and denominator to eliminate the pole zero pair on the real axis, the transfer function becomes the biquadratic form shown in Equation 4.

$$F_{(s)}=\frac{\left[K_4\left[S^2+2S\left\{d+\frac{a(c-2a)}{(a+c)}-\frac{K_12a(c-a)}{K_4(a+c)}-\frac{K_3(d-a)}{K_4}\right\}+\frac{a(c-a)(2d-a)}{(a+c)}-\frac{K_32a(c-a)(d-a)}{K_4(a+c)}\right]\right]}{S^2+\frac{2a^2S}{(a+c)}+\frac{a^2(c-a)}{(a+c)}}$$

Equation 4

If $a^2/(a+c)$ is set equal to $\sigma_p$ and $a^2(c-a)/(a+c)$ is set equal to $\omega_p^2$ and finally if $\omega_z^2$ is equal to $\omega_p^2[1+(2R_{18}/K_4R_{24})](K_4-K_3)$ then the transfer function may be expressed as the following Equation 5.

$$F_{(s)} = \frac{K_4\left[S^2+2\sigma_p S\left\{\frac{a(\omega_p^2+\omega_z^2)}{2\sigma_p\omega_p^2}+\frac{R_{18}}{2R_{10}}-\frac{K_1R_{18}}{K_4R_{10}}-1\right\}+\omega_p^2\left\{1+\frac{2R_{18}(K_4-K_3)}{K_4R_{24}}\right\}\right]}{S^2+2\sigma_p S+\omega_p^2}$$

Equation 5

This can be further simplified to the form of Equation 6.

$$F_{(s)}=[K_4(S^2+2\sigma_z S+\omega_z^2)]/(S^2+2\sigma_p S+\omega_p^2)$$

Equation 6

Equation 6 holds true where $$\sigma_z=\sigma_p\left[\frac{a(\omega_p^2+\omega_z^2)}{2\sigma_p\omega_p^2}+\frac{R_{18}}{2R_{10}}-\frac{K_1R_{18}}{K_4R_{10}}-1\right]$$

This transfer function of Equation 6 produces two complex poles and two complex zeros in the $S$ plane. If $K_1$, $K_3$, and $K_4$ are required to be less than 1, they may be implemented by the resistive dividers shown in FIG. 2. In other words, $$K_1=R_{46}/(R_{10}'+R_{46})$$

The resistance 10' is not the same resistance as resistance 10 of FIG. 1. Rather, the parallel impedance of resistor 10' and resistor 46 is the same as resistor 10 of FIG. 1.

The value of resistors 42 and 44 should be chosen to minimize DC offset error in the amplifier 22. However, the value of these resistors determines $K_4$ as follows:

$$K_4=R_{44}/(R_{42}+R_{44})$$

The required value of $K_3$ depends upon the desired ratio of $\omega_z$ and $\omega_p$ and is most conveniently allowed to be 1 or 0. Thus, $K_3$ equals 0 where the pole frequency ($\omega_p$) is equal to or less than the zero frequency ($\omega_z$). For all other cases, $K_3$ equals 1 or in other words where the pole frequency is greater than the zero frequency.

The design of this circuit is accomplished by equating the coefficients of $S$ in Equations 4 and 5 with the desired quantities in Equation 6. One procedure which may be used is as follows:

1. Choose capacitor $C_{14}$; define $\omega_z$, $\sigma_z$, $\omega_p$, $\sigma_p$, and the required gain. As previously indicated, $\omega_z$ and $\omega_p$ refer to the zero and pole frequencies, respectively; while $\sigma_z$ and $\sigma_p$ refer to the position of the zero and pole positions along the real axis. The required gain should be chosen based upon the filter type to be designed; i.e., low pass, bandpass, or high pass.
2. $R_{10}'=\sigma_p/\omega_p^2C_{14}$
3. $R_{32}=R_{10}'[-1+\sqrt{1+\omega_p^2/\sigma_p^2}]$
4. $R_{40}=R_{18}=R_{32}$ and $C_{36}=C_{38}=C_{14/2}$
5. As previously indicated, if the pole frequency is equal to or less than the zero frequency, $K_3$ equals 0 and otherwise $K_3$ equals 1.
6. Depending upon the filter, $K_4$ may be calculated from one of the following equations. With $A_{DC}$ being the gain at zero frequency, $K_4$ equals $A_{DC}(\omega_p/\omega_z)^2$. If $A\omega_p$ equals the gain at the pole frequency, then $$K^4=\frac{A\omega_p}{\sqrt{\left[\frac{\omega_z^2-\omega_p^2}{2\sigma_p\omega_p}\right]^2\left[+\frac{\sigma_z}{\omega_p}\right]^2}}$$

If $A_\infty$ equals the gain at infinite frequency, then $$K_4=A_\infty$$

7. $K_1$ may be calculated by letting the Q equal $\omega_p/2\sigma_p$ $$K_1=\frac{K_4}{2}\left[\frac{(1+\sqrt{1+4Q^2})(1+\omega_z^2/\omega_p^2)-2(1+\sigma_z/\sigma_p)}{2(-1+\sqrt{1+4Q^2})}+1\right]$$

8. $R_{24}$ may be calculated as follows:

$$R_{24}=[2R_{18}(1-K_3/K_4)]/[(\omega_z/\omega_p)^2-1]$$

9. $R_{10}'$, $R_{46}$, $R_{42}$, $R_{44}$ may be calculated as follows:

$$R_{10}'=R_{10}/K_1$$

$$R_{46}=R_{10}'/(1/K_1-1)$$

$$R_{42}=2R_{18}R_{24}/(2R_{18}+R_{24})K_4$$

$$R_{44}=R_{42}/(1/K_4-1)$$

One embodiment of the invention utilized the following component values as a filter section for a multisection lowpass filter.

$R_{40}=37.4K=R_{18}$
$R_{32}=18.7K$
$R_{10}'=2.61K$
$R_{24}=45.3K$
$K_3=0$ volts
$R_{46}=3.48K$
$R_{42}=75.0K$
$R_{44}=45.3K$
$C_{14}=2400$ pf
$C_{36}=C_{38}=1200$ pf As will be noted by comparing FIG. 1 to FIG. 3, the present invention not only eliminates one capacitor from the prior art embodiment but also eliminates one resistor if resistors 10 and 24 are excluded. As previously explained, resistor 10 accomplished the same function as resistor 68 of FIG. 3. While FIG. 2 does contain several more resistors than FIG. 3, FIG. 2 is a much more complex filter and can accomplish functions that can not be accomplished with the prior art circuit of FIG. 3.

As will be realized from the above equations, the present invention does not use all of the resistors and capacitors of FIG. 2 in all embodiments. Rather, the basic invention utilizes the circuitry of FIG. 1 less the resistors 10 and 24 as the basic invention and the additional resistors are utilized to provide increased functionality of the circuit.

I therefore wish to be limited not by the specification but only by the appended claims wherein:

1. Active filter apparatus comprising, in combination differential amplifier means including first and second input means, output means, and reference potential means;

first means for supplying a signal, to be filtered, with respect to said reference potential means;

second means, connected to said output means of said amplifier means, for supplying filtered apparatus output signals;

first and second resistive means connected in series between said output means and said first input means of said amplifier means;

first and second capacitive means connected in parallel with said first and second resistive means;

third resistive means connected at one end to a point intermediate said first and second capacitive means;

third capacitive means connected at one end to a point intermediate said first and second resistive means;

third means connecting the other end of both said third resistive means and said third capacitive means to said first means;

fourth resistive means connected between said second input means of said amplifier means and said first means; and fifth resistive means connected between said second input means of said amplifier means and said reference potential means.

2. Active filter apparatus representable by poles and zeros in a complex frequency plane comprising, in combination:

differential amplifier means including first and second input means, output means, and reference potential means;

first means for supplying a signal, to be filtered, with respect to said reference potential means;

second means, connected to said output means of said amplifier means, for supplying filtered apparatus output signals;

first and second resistive means connected in series between said output means and said first input means of said amplifier means;

first and second capacitive means connected in parallel with said first and second resistive means;

third resistive means connected at one end to a point intermediate said first and second capacitive means;

third capacitive means connected at one end to a point intermediate said first and second resitive means;

third means connecting the other end of both said third resistive means and said third capacitive means to said first means; and fourth resistive means connected at one end to said first input means of said amplifier means and connected at the other end to said first means when the pole frequency of the filter apparatus is greater than the zero frequency and connected at the other end to said reference potential means when the pole frequency equals or is less than the zero frequency.

3. Apparatus as claimed in claim 2 wherein said third means includes an impedance for increasing the distance of the poles from the imaginary axis of a pole-zero representation of the filter.

* * * * *